US006734682B2

(12) United States Patent
Tallman et al.

(10) Patent No.: US 6,734,682 B2
(45) Date of Patent: May 11, 2004

(54) TESTING DEVICE FOR DETECTING AND LOCATING ARC FAULTS IN AN ELECTRICAL SYSTEM

(75) Inventors: David M. Tallman, Marshall Township, PA (US); William J. Murphy, Cranberry Township, PA (US); Robert T. Elms, Monroeville, PA (US)

(73) Assignee: Eaton Corporation

( * ) Notice: Subject to any disclaimer, the term of this patent is extended or adjusted under 35 U.S.C. 154(b) by 42 days.

(21) Appl. No.: 10/090,991

(22) Filed: Mar. 5, 2002

(65) Prior Publication Data

US 2003/0169051 A1 Sep. 11, 2003

(51) Int. Cl.[7] .............................................. G01R 31/28
(52) U.S. Cl. ......................... 324/528; 324/536; 361/42
(58) Field of Search .............................. 361/42, 64, 67, 361/68, 45; 324/522, 523, 528, 536, 537, 556, 539, 67; 73/587; 340/657, 660, 664; 702/57–59, 64, 75, FOR 103, FOR 104, FOR 107

(56) References Cited

U.S. PATENT DOCUMENTS

| 4,081,852 | A | | 3/1978 | Coley et al. ................. 361/45 |
| 4,144,487 | A | | 3/1979 | Pharney ....................... 361/522 |
| 5,224,006 | A | | 6/1993 | MacKenzie et al. ........... 361/45 |
| 5,459,630 | A | | 10/1995 | MacKenzie et al. ........... 361/45 |
| 5,608,328 | A | * | 3/1997 | Sanderson ................... 324/529 |
| 5,691,869 | A | | 11/1997 | Engel et al. .................. 361/42 |
| 5,729,145 | A | * | 3/1998 | Blades ......................... 324/536 |
| 5,982,593 | A | | 11/1999 | Kimblin et al. ............... 361/42 |
| 6,072,317 | A | | 6/2000 | MacKenzie .................. 324/536 |
| 6,084,756 | A | | 7/2000 | Doring et al. ................. 361/45 |
| 6,437,572 | B1 | * | 8/2002 | Vokey ......................... 324/326 |
| 6,545,485 | B1 | * | 4/2003 | Sanderson ................... 324/536 |

OTHER PUBLICATIONS www.munroelectric.com/catalog/greenlee/circuit.html; "Circuit Tracer Application Guide", pp. 2–4, Feb. 15, 2002.

* cited by examiner

Primary Examiner—N. Le
Assistant Examiner—Vincent Q. Nguyen
(74) Attorney, Agent, or Firm—Martin J. Moran

(57) ABSTRACT

A testing device for detecting and locating an arcing fault in an electrical system includes a detector circuit for detecting one or more characteristics of the arcing fault proximate the arcing fault and outputting a responsive signal. An annunciator speaker or display annunciates the responsive signal when the detector circuit is proximate the arcing fault, in order to locate the arcing fault in the electrical system.

4 Claims, 5 Drawing Sheets

TESTING DEVICE FOR DETECTING AND LOCATING ARC FAULTS IN AN ELECTRICAL SYSTEM

CROSS-REFERENCE TO RELATED APPLICATION

This application is related to commonly assigned, concurrently filed U.S. patent application Ser. No. 10/091,074, filed Mar. 5, 2002, entitled "Low Energy Pulsing Device and Method for Electrical System Arc Detection".

BACKGROUND OF THE INVENTION

1. Field of the Invention

This invention relates to testing of electrical systems and, more particularly, to devices for arc fault and/or ground fault testing of electrical distribution circuits.

2. Background Information

The common type of circuit breaker used for residential, commercial, and light industrial applications has an electro-mechanical thermal-magnetic trip device to provide an instantaneous trip in response to a short circuit and a delayed trip in response to persistent overcurrent conditions. Some of these circuit breakers include ground fault protection, which trips the ground fault circuit interrupter, (GFCI) in response to a line-to-ground fault, and in some cases, a neutral-to-ground fault. Ground fault protection is provided by an electronic circuit which is set to trip at about 4 to 6 mA of ground fault current for people protection, and at about 30 mA for equipment protection. It is known to incorporate a test circuit in the circuit breaker, which tests at least portions of the electronic ground fault trip circuit. It is also known to test for proper wiring connections. Test circuits for this purpose are commercially available.

Recently, there has been rising interest in also protecting such power distribution circuits, and particularly the branch circuits for homes, commercial and light industrial applications, from arcing faults. Arcing faults are intermittent, high impedance faults, which can be caused for instance by worn or damaged insulation, loose connections, broken conductors and the like. Arcing faults can occur in the permanent wiring, at receptacles, or more likely, in the wiring of loads or extension cords plugged into a receptacle. Because of the intermittent and high impedance nature of arcing faults, they do not generate currents of sufficient instantaneous magnitude or sufficient average current to trigger the thermal-magnetic trip device which provides the short circuit and overcurrent protection.

Various types of arc fault detectors have been developed and/or proposed. Generally, the detectors are of two types. One type responds to the random high frequency noise content of the current waveform generated by an arc. This high frequency noise tends to be attenuated, especially by the presence of filters on some loads, which can be connected to the branch circuit. The other basic type of arc fault detector responds to the step increase in current occurring as the arc is repetitively and randomly struck. Examples of arc fault detectors of the latter type are disclosed in U.S. Pat. Nos. 5,224,006; and 5,691,869.

U.S. Pat. No. 5,459,630 discloses several forms of built-in test circuits for arc fault detectors. In one embodiment, in which the arc fault detector utilizes a coil to sense current, the test circuit adds a capacitor which forms with the impedance of the coil an oscillator generating a waveform with an amplitude which simulates the rapid rise of a step change in current produced by an arc. In another embodiment, the user must repetitively close a switch, which connects a resistor between the line conductor and neutral, to again generate large amplitude pulses.

While the built-in arc fault and ground fault testers test the response of the electronic circuits to simulated conditions, they do not necessarily indicate whether the device will adequately respond in a real installation. One difficulty is that the circuit breaker containing the detectors is located at a load center together with the circuit breakers for other circuits in the installation. However, the fault condition can occur anywhere downstream and can be further distanced from the circuit breaker and detectors by an extension cord. The wiring, and particularly the extension cord, can insert considerable resistance between the fault and the detector, which attenuates the signal sensed by the detector. When the effects of this resistance are combined with the low amplitude of the currents generated by these faults, the detectors may not have sufficient sensitivity to detect remote faults. Another problem can arise when a receptacle is not connected as intended.

Detection of an arcing fault is complicated by the fact that some normal loads can produce waveforms similar to arcing faults. Arc fault detectors attempt to distinguish over such phenomena to minimize nuisance faults. The task is further complicated by the fact that, as mentioned above, arcing faults tend to be smaller in amplitude than dead faults.

With the introduction of arc fault circuit interrupter (AFCI) devices, such as arc fault circuit breakers, there exists the need for an apparatus for determining the location of problems within electrical wiring. There is a need for a troubleshooting tool to permit users, such as electricians, to identify and locate arc fault, ground fault and other system wiring problems that may be encountered during and after the installation of the AFCI device.

There is also a need for such test devices, which are flexible, simple, safe and economical.

SUMMARY OF THE INVENTION

These needs and others are met by the present invention, which provides a testing device for detecting and locating an arcing fault having one or more characteristics in an electrical system. Furthermore, the testing device may be employed to locate electrical conductors and/or to detect one or more faults in the electrical system. Also, the testing device may be used in combination with a pulsing device, which produces a periodic arcing signal to cause one or more of the arcing fault characteristics, in order to provide a testing system for detecting and locating an arcing fault in the electrical system.

As one aspect of the invention, a testing device for detecting and locating an arcing fault in an electrical system comprises: means for detecting at least one of a plurality of characteristics of the arcing fault proximate the arcing fault and outputting a responsive signal; and means for annunciating the responsive signal when the means for detecting is proximate the arcing fault, in order to locate the arcing fault in the electrical system.

One of the characteristics may be a radio frequency signal, and the means for detecting may include an antenna for receiving the radio frequency signal and a radio frequency detector for detecting the received radio frequency signal.

One of the characteristics may be an ultrasonic sound, and the means for detecting may include a pick-up coil for receiving the ultrasonic sound and outputting a corresponding electrical signal, and means for detecting the electrical signal.

One of the characteristics may be an audible sound, and the means for detecting may include a pick-up coil for receiving the audible sound and outputting a corresponding electrical signal, and means for detecting the electrical signal.

As another aspect of the invention, a testing device for detecting and locating an arcing fault in an electrical system comprises: means for locating a plurality of the electrical conductors of the electrical system; means for detecting at least one of a plurality of characteristics of the arcing fault proximate one of the electrical conductors and outputting a responsive signal; and means for annunciating the responsive signal when the means for detecting is proximate the arcing fault.

As another aspect of the invention, a testing device for detecting faults in an electrical system, and for detecting and locating an arcing fault in the electrical system comprises: means for testing the electrical system to detect at least one fault in the electrical system; means for detecting at least one of a plurality of characteristics of the arcing fault proximate the arcing fault and outputting a responsive signal; and means for annunciating the responsive signal when the means for detecting is proximate the arcing fault.

The means for testing may include means for conducting a ground fault test of the electrical system. The means for conducting a ground fault test may include first means for engaging a line conductor of the electrical system, second means for engaging a ground conductor of the electrical system; and means for adjusting a load between the first and second means, in order to provide between about 6 to 100 mA of leakage current in the line conductor and the ground conductor.

As another aspect of the invention, a testing system for detecting and locating an arcing fault in an electrical system comprises: means for producing an arcing signal to cause at least one of a plurality of characteristics of the arcing fault; and a testing device comprising: means for detecting the at least one of the characteristics of the arcing fault proximate the arcing fault and outputting a responsive signal, and means for annunciating the responsive signal when the means for detecting is proximate the arcing fault.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention is preferably used in combination with a suitable pulsing device such as disclosed in commonly assigned, concurrently filed application Ser. No. No. 10/091,074, filed Mar. 5, 2002, entitled "Low Energy Pulsing Device and Method for Electrical System Arc Detection".

Figure 1:
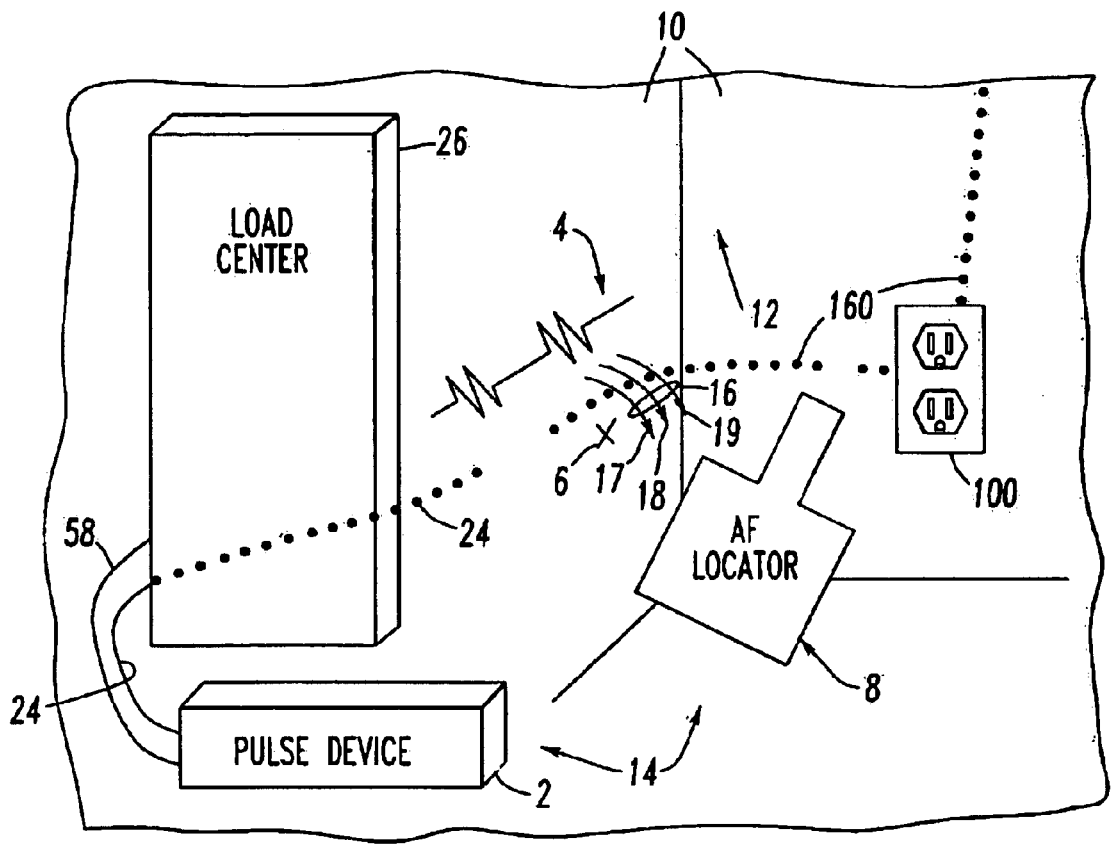
FIG. 1 is a block diagram of a system including a pulsing device, which generates relatively low energy, low duty cycle pulses for arc fault testing, and an arc fault locating and testing device in accordance with the present invention.

Referring to FIG. 1, the exemplary pulsing device 2 produces a suitable periodic arcing signal 4, in order to locate and detect an intermittent arcing fault 6. The exemplary arc fault locating and testing device 8 is employed in combination with the pulsing device 2 and can be moved, for example, along the walls 10 of a building 12 to physically determine the location of the arcing fault 6 inside the building 12. The pulsing device 2 and the arc fault locating and testing device 8 form a testing system 14 for detecting and locating the source(s) of the arcing fault(s) 6 in an electrical system. Hence, the testing system 14 physically determines the location of such an arcing fault 6 inside the building 12.

As discussed below in connection with FIGS. 3, 4 and 7, the arcing fault 6 has one or more characteristics 16, which are detected by the testing device 8. The characteristics 16 include, but are not limited to, for example, a signal having a frequency such as, for example, a radio frequency signal 17, an ultrasonic sound 18, and an audible sound 19.

Figure 2:
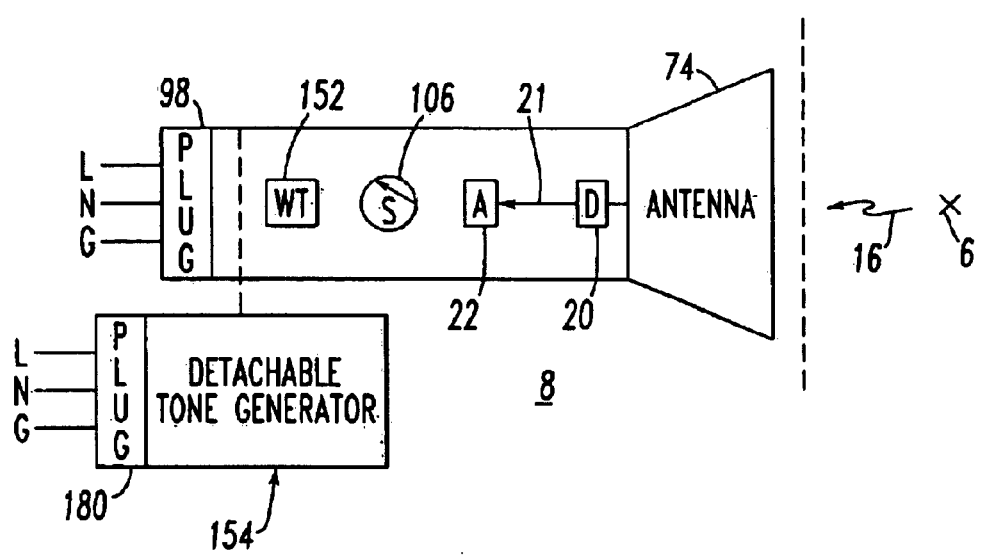
FIG. 2 is a block diagram of the arc fault locating and testing device of FIG. 1.

Also referring to FIG. 2, the testing device 8 includes a detector circuit (D) 20 for detecting one or more of the arcing fault characteristics 16 proximate the arcing fault 6. In response to detecting the arcing fault 6, the circuit 20 outputs a responsive signal 21. The testing device 8 also includes an annunciator circuit (A) 22 for annunciating the responsive signal 21 when the circuit 20 is proximate the arcing fault 6, in order to locate such arcing fault in an electrical system, such as a power circuit 24, of the building 12.

Figure 3:
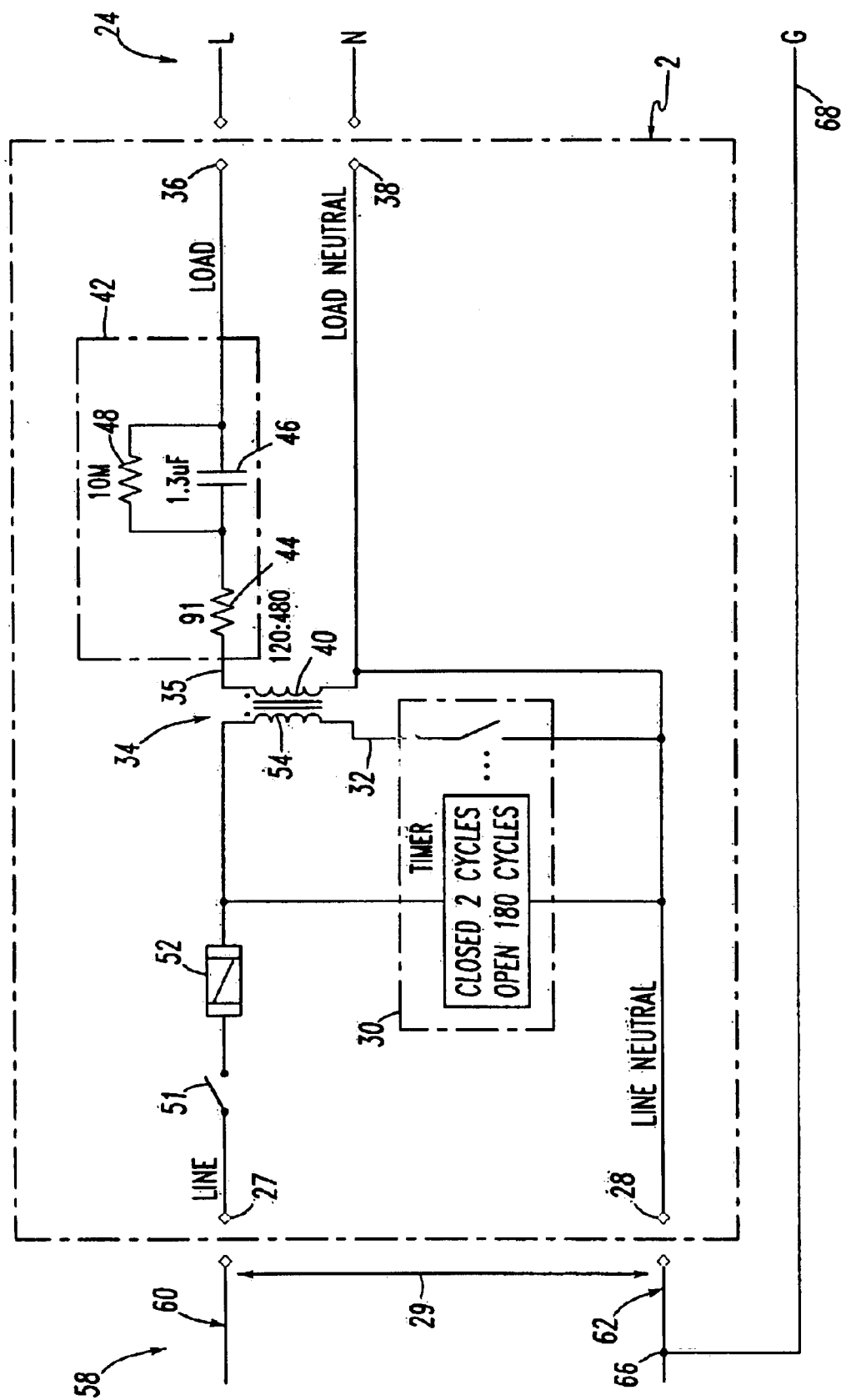
FIG. 3 is a block diagram in schematic form of the pulsing device of FIG. 1.

Referring now to FIG. 3, the pulsing device 2 applies a low duty cycle, low energy 480 $VAC_{RMS}$ voltage to the power circuit 24 (e.g., of load center 26 of FIG. 1). The voltage is applied for about two cycles every about three seconds. The current is limited to about 0.25 $AAC_{RMS}$, with the average current being a suitably safe value of less than about 4 mA and, preferably, about 2.8 mA. Although the arcing fault 6 may, normally, be relatively intermittent in the electrical system for a nominal 120 $VAC_{RMS}$ line voltage, with the low duty cycle, low energy 480 $VAC_{RMS}$ voltage being applied to the power circuit 24 by the pulsing device 2, the arcing fault 6 becomes periodic.

The pulsing device 2 generates relatively low energy, low duty cycle pulses for arc fault testing of the power circuit 24. The pulsing device 2 includes a line terminal 27 and a line neutral terminal 28 structured to input a line voltage 29 (e.g., a nominal 120 $VAC_{RMS}$ line voltage). A suitable timing mechanism or circuit 30 generates a signal 32 having a duty cycle from the line voltage 29. A step up transformer 34 transforms the line voltage 29 to a relatively higher voltage 35 (e.g., a nominal 480 $VAC_{RMS}$ line voltage) having the duty cycle. The pulsing device 2 also includes a load terminal 36 and a load neutral terminal 38, which is electrically connected to one side of the secondary winding 40 of the transformer 34. A circuit 42 is electrically connected between tie other side of the transformer secondary winding 40 and the load terminal 36 for outputting a current at about the relatively higher voltage 35. The circuit 42 includes a first resistor 44 electrically connected in series with a capacitor 46. The series combination of the first resistor 44 and the capacitor 46 are electrically connected between the transformer secondary winding 40 and the load terminal 36. A second resistor 48 is electrically connected in parallel with the capacitor 46.

The exemplary pulsing device 2 employs the transformer 34 to step up the 120 $VAC_{RMS}$ line voltage 29 from the line terminal 27 and to periodically (e.g., about every 3 s) apply 480 $VAC_{RMS}$ to the load terminal 36 for about two cycles. If the insulation of the power circuit 24 is not faulty, then no arcing breakdown occurs. On the other hand, if the insulation has failed or is sufficiently degraded, then current limited (e.g., about 0.25 $AAC_{RMS}$) arcing occurs. In turn, the testing device 8 (FIGS. 1 and 2) detects that arcing.

The timing mechanism or circuit 30 of the pulsing device 2 pulses the 480 $VAC_{RMS}$ load terminal 36 "ON" for about two cycles and "OFF" for about 178 cycles out of about every three seconds (i.e., two cycles out of about every 180 cycles). Hence, during an arcing fault, the average value of the current, as advantageously limited by the duty cycle, is less than about 4 mA, which is a safe value of average current (e.g., less than about the 4 to 6 mA ground fault trip threshold for people protection) as permitted by UL 943 (Ground-Fault Circuit-Interrupters intended for use in alternating current circuits, such as 120 $VAC_{RMS}$ or 120/240 $VAC_{RMS}$, 50 or 60 Hz circuits). For the exemplary duty cycle, the average value of the current is about 2.8 mA (i.e., 0.25 $AAC_{RMS} \times (2/180)$).

The pulsing device 2 preferably includes a circuit interrupting device, such as the exemplary slow blow fuse (e.g., 0.5 A) 52, which is electrically connected between the line terminal 27 and the primary winding 54 of the transformer 34. A ratio of the count of the turns of the transformer secondary winding 40 to the count of the turns of the primary winding 54 is about four, in order to step up the exemplary 120 $VAC_{RMS}$ line voltage 29 to the 480 $VAC_{RMS}$ voltage 35.

The line voltage 29 is obtained from a power feed 58 from the load center 26 of FIG. 1. The power feed 58 includes a line conductor 60, a neutral conductor 62 and ground conductor 64. As is conventional, the neutral conductor 62 and ground conductor 64 are electrically connected at a common node 66. Similarly, the ground conductor 68 of the power circuit 24 is also electrically connected to the common node 66. Another terminal, such as pigtail (ground) 70, is structured for electrical connection to the common ground node 66 either directly not shown) or else through the ground conductor 64 as shown in FIG. 3.

Figure 4:
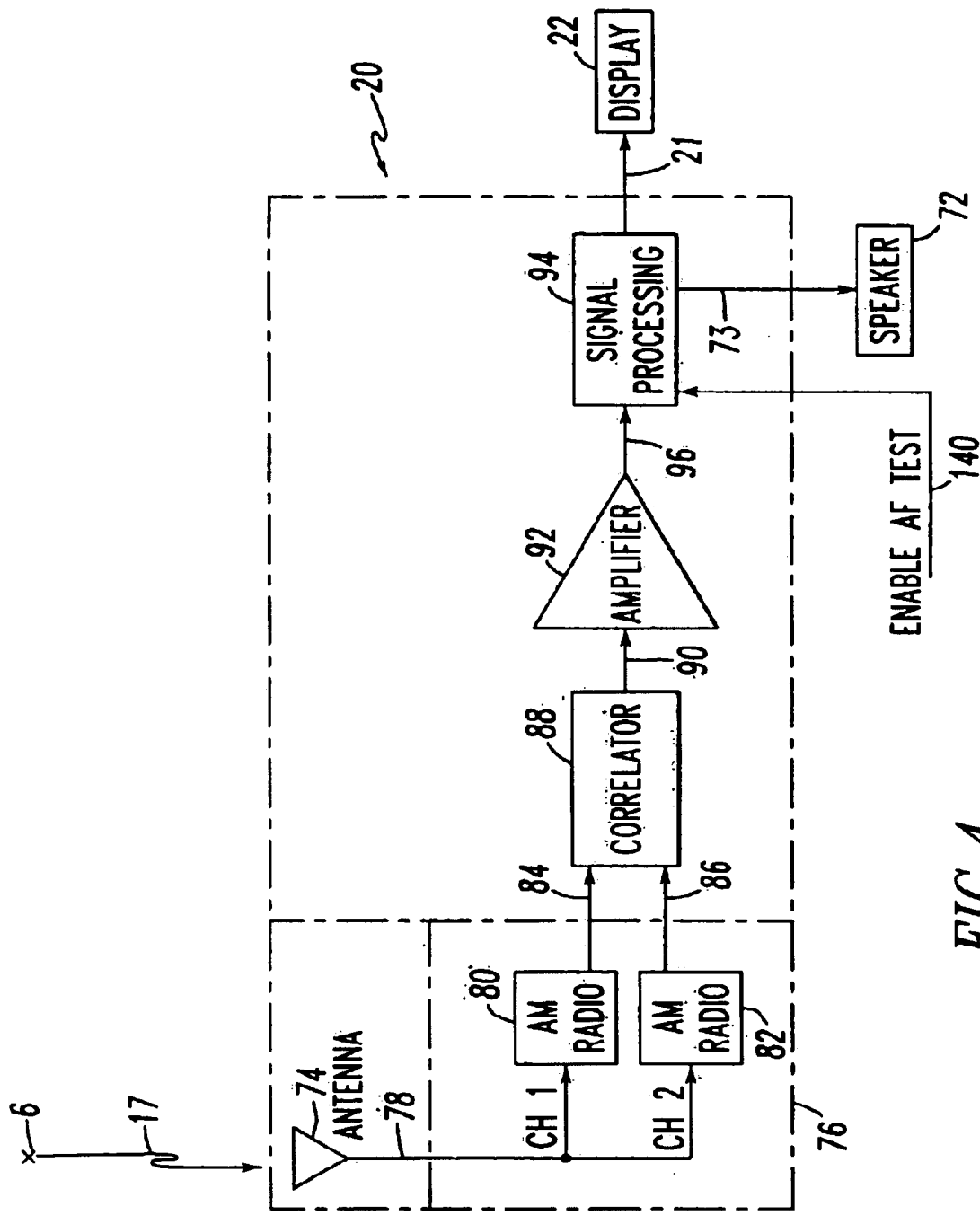
FIG. 4 is a block diagram of an arc fault locator circuit of the testing device of FIG. 2 including an antenna for receiving a radio frequency signal and a radio frequency detector for detecting the received radio frequency signal.

Referring to FIG. 4, the detector circuit 20 and the annunciator circuit 22 of the testing device 8 of FIG. 2 are shown. The annunciator circuit, which in the exemplary embodiment is a suitable visual indicator, such as display 22, permits the user to physically determine the location of the arcing fault 6 inside the building 12 of FIG. 1. In addition to (or as an alternative to) the display 22, the testing device 8 may also (or alternatively) include a suitable audible indicator, such as a speaker 72, which is driven by another responsive signal 73 from the detector circuit 20.

The detector circuit 20 also includes a radio frequency detector 76 for detecting AM band radio frequency signals 78 from the antenna 74. An arcing fault, such as 6, normally produces broadband RF noise. The two exemplary amplitude modulation (AM) radio receivers 80,82 are tuned to two different AM radio channels (e.g., 1000 kHz and 1200 kHz).

A correlator 88 looks at the relative signal magnitude of the two frequency signal outputs 84,86 and produces a correlation signal 90 based on the degree of correlation. Since the arc fault signal is broadband, it will appear on both outputs 84,86, thereby producing a high degree of correlation. Also, the magnitude of the correlation signal 90 is proportional to the distance from the antenna 74 to the source of the arcing fault 6. Amplifier 92 conditions the signal 90 to produce a scaled signal 96 with a magnitude equal to, for example, 1 V at a distance of 1 meter from the arcing fault source. A signal processor 94 receives the scaled signal 96 and produces an output 21 of, for example, 0 to 2 V. The display 22 is, for example, a digital voltmeter calibrated in meters with distance displayed, for example, as 0 to 2 meters.

Alternatively, the signal processor 94 produces a variable audio frequency output 73 that has fixed amplitude. The audio frequency is proportional to the distance from the arc fault signal source 6 to the antenna 74 (e.g., frequency=function (magnitude), in which, for example, a relatively low frequency corresponds to a relatively low degree of correlation and a relatively high frequency corresponds to a relatively high degree of correlation).

As another alternative, the signal processor 94 produces a fixed audio frequency output 73 that has amplitude proportional to the distance from the arc fault signal source 6 to the antenna 74 (e.g., volume=function (magnitude), in which, for example, a relatively low volume corresponds to a relatively low degree of correlation and a relatively high volume corresponds to a relatively high degree of correlation).

Figure 5:
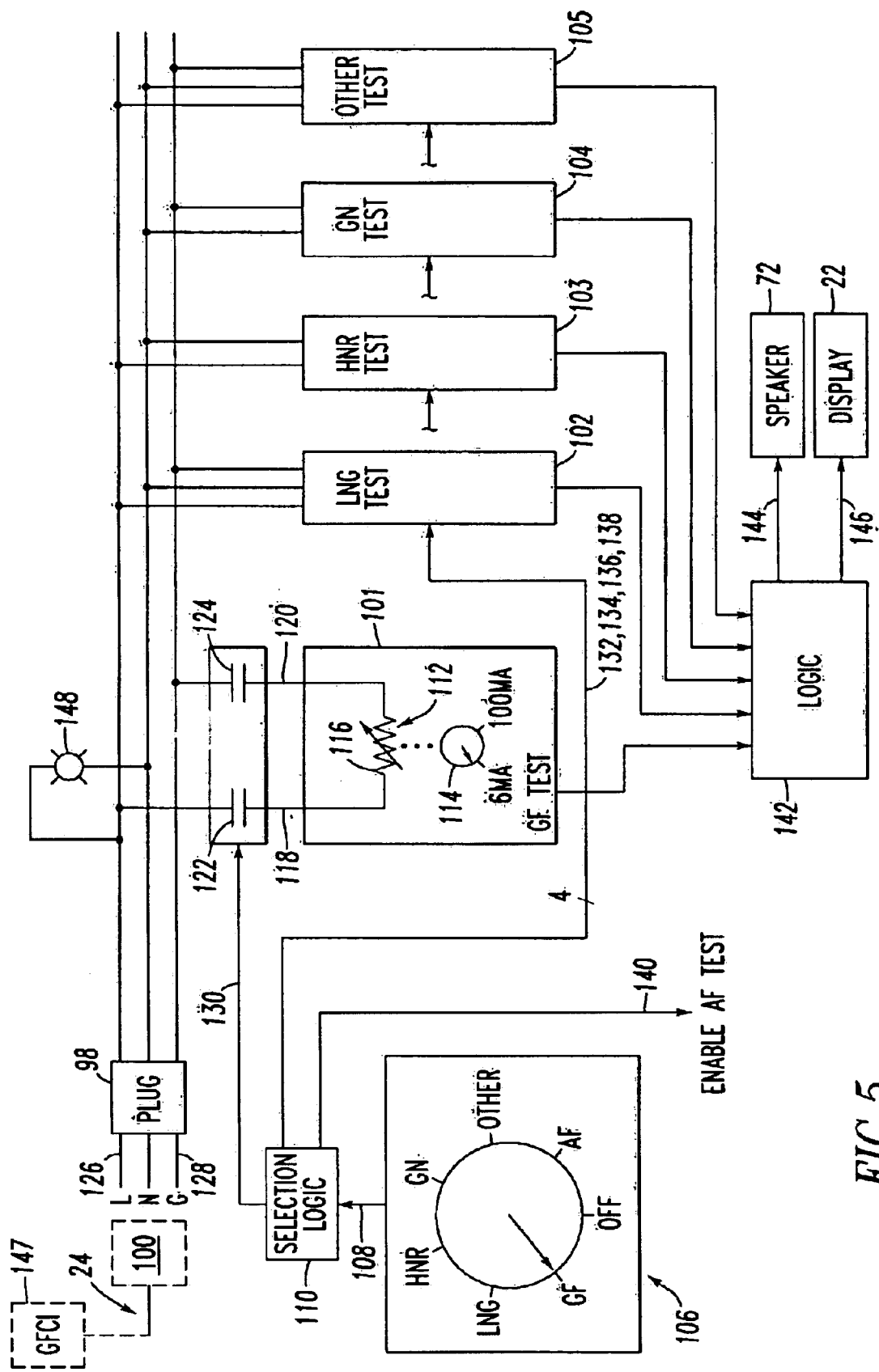
FIG. 5 is a block diagram of various fault test circuits of the testing device of FIG. 2.

Referring to FIGS. 2 and 5, the exemplary testing device 8 preferably includes a conventional three-prong plug 98 for engagement with a conventional electrical outlet, such as receptacle 100 of FIG. 1. As shown in FIG. 5, the testing device 8 preferably also includes one or more of test circuits 101, 102, 103, 104, and 105 for determining one or more faults in the power circuit 24 by respectively performing: (1) a ground fault (GF) test as discussed below; (2) a conventional open neutral, line or ground (LNG) test; (3) a conventional hot and neutral reversed (HNR) test; (4) a conventional grounded neutral (GN) test; and (5) various electrical wiring analysis (OTHER) tests (e.g., available short circuit current, line voltage, percent voltage drop at 15 A) of the receptacle power circuit 24. As shown in FIG. 5, the testing device 8 includes a seven-position selector switch (S) 106, the output 108 of which is input by selection logic 110 for initiating a corresponding one of the test circuits 101–105.

Most GFCIs, which are adapted for people protection, trip at about 4 to 6 mA of ground fault current, while other GFCIs, which are adapted for equipment protection, trip at about 30 mA. However, some relatively new, low cost AFCIs are adapted to trip at about 30 to 100 mA of earth leakage current. The exemplary ground fault test circuit 101 provides the capability to discretely or continuously adjust a load, in order to provide between about 6 to 100 mA of ground/earth leakage current. For example, the test circuit 101 includes a potentiometer 112, which is continuously adjustable from adjustment knob 114. The variable resistance 116 of the potentiometer 112 is suitably selected, in order to generate a test signal, such as between about 6 to 100 mA of leakage current in the conductors 118 and 120. Those conductors 118 and 120 are electrically interconnected through switches 122 and 124 (e.g., relay contacts) to line terminal 126 and ground terminal 128, respectively, of the three-prong plug 98. Whenever the seven-position selector switch 106 is at the GF position, the switch output 108 assumes a state, such that the selection logic 110 outputs signal 130, in order to enable or close the switches 122,124. Otherwise, when the switches 122,124 are open, the test circuit 101 is disabled and the variable resistance 116 of the potentiometer 112 is suitably electrically isolated from the power circuit 24 associated with the receptacle 100.

Similarly, for the other switch positions LNG, HNR, GN, OTHER and AF, corresponding enable signals 132, 134, 136, 138 and 140 are output to enable the test circuits 102, 103, 104, 105 and the AF detector circuit (D) 20 (FIG. 4), respectively. Otherwise, in the OFF position of the switch 106, the test circuits 101–105 and the AF detector circuit (D) 20 are disabled.

Preferably, suitable logic 142 monitors the test circuits 101–105 and outputs an audible signal 144 or a visual signal 146 to the speaker 72 or display 22, respectively, of FIG. 4, in order to indicate the success and/or failure of the corresponding test, thereby detecting and annunciating a corresponding fault in the power circuit 24.

For the ground fault test circuit 101, additional feedback is available to the user. For example, the upstream GFCI 147 (shown in phantom line drawing in FIG. 5) should normally trip at a predetermined level of ground fault current as adjusted on the potentiometer adjustment knob 114 by the user. Hence, the user can readily determine loss of power in the power circuit 24 (and the success of the ground fault test of that power circuit, including the GFCI 147) associated with the receptacle 100 by a corresponding electrical device (e.g., test lamp 148) being extinguished at about the appropriate ground fault current level as shown by the knob 114. For example, as a preferred practice, the user first sets the potentiometer adjustment knob 114 to a minimum value of current (i.e., maximum value of resistance), then selects the position GF of the selector switch 106, then adjusts the potentiometer adjustment knob 114 to provide a suitable value of ground fault current, and finally verifies that the test lamp 148 is extinguished by the upstream GFCI 147 at the appropriate level of current.

Figure 6:
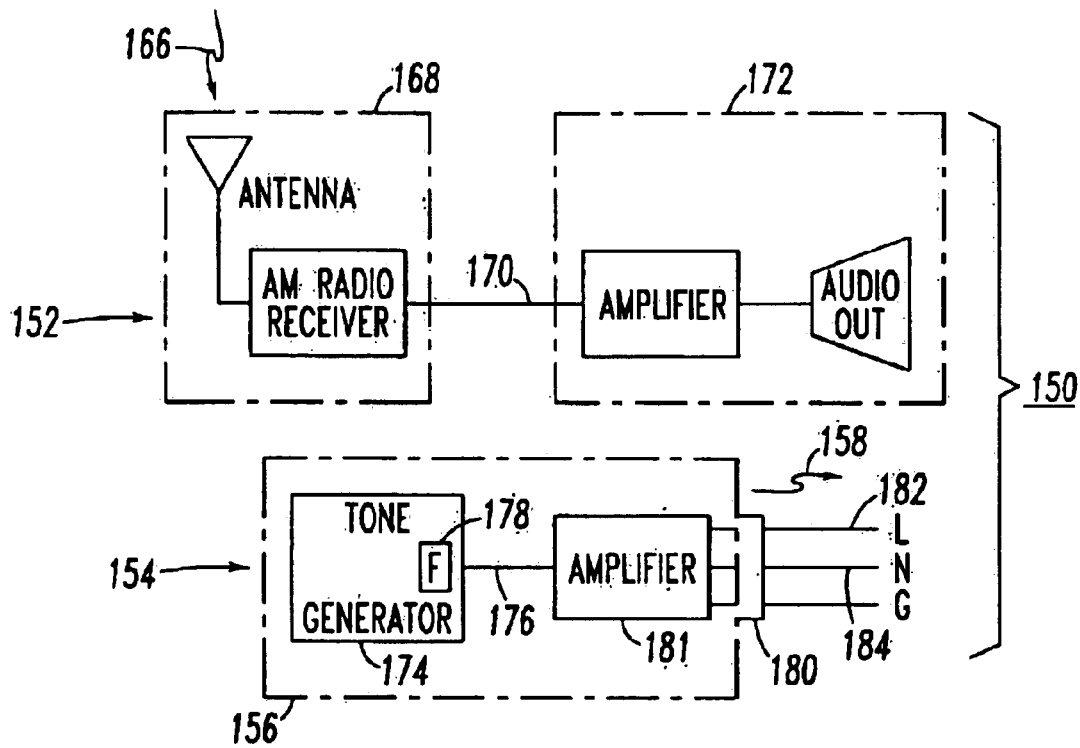
FIG. 6 is a block diagram of a wire locating circuit and a removable tone generating circuit of the testing device of FIG. 2.

Referring to FIGS. 2 and 6, the exemplary testing device 8 preferably includes a wire locating circuit 150 having a wire-tracing (WT) receiver 152 and, also, a removable tone generating circuit 154 having a plug-in transmitter 156 to generate a tone signal 158 from a conventional receptacle, such as 100 of FIG. 1, to hidden wires (e.g., 160 inside the walls 10 (and floors and ceilings)) of the building 12 of FIG. 1. As shown in FIG. 1, the power circuit 24 has a plurality of electrical conductors 160, and the wire locating circuit 150 of FIG. 6 locates such electrical conductors.

The wire locating circuit 150 includes the wire-tracing receiver 152 for locating the electrical conductors 160, and the removable tone generating circuit 154 for generating a signal 166 having a frequency (or tone) in the electrical conductors 160. The receiver 152 includes an AM radio receiver circuit 168 for detecting the signal 166 proximate one or more of the electrical conductors 160 and outputting a second responsive signal 170, and a circuit 172 for annunciating the second responsive signal 170 when the circuit 168 is proximate one or more of the electrical conductors 160.

The plug-in transmitter 156 includes a tone generator circuit 174 for generating a signal 176 having a frequency (F) 178, and an alternating current plug 180 having at least two prongs 182,184. The transmitter 156 includes a capacitively coupled amplifier 181, which generates the tone signal 158 between the prongs 182,184 of the alternating current plug 180. The prongs 182,184 are structured to engage an alternating current receptacle, such as 100 of FIG. 1.

Although FIG. 4 shows the antenna 74 and the radio frequency detector 76 for detecting the broadband radio frequency signal 17 of the arcing fault 6, other circuits may be employed to detect other characteristics of such arcing fault. For example, any suitable detector circuit or suitable signal gathering mechanism for receiving a signal having a frequency and outputting a corresponding electrical signal may be employed with a suitable frequency detector circuit to detect that electrical signal. Hence, the signals 84,86 applied to the correlator 88 of FIG. 4 may be based upon any two of the following signals: one or two radio frequency signals, one or two ultrasonic signals, and one or two audible signals.

Figure 7:
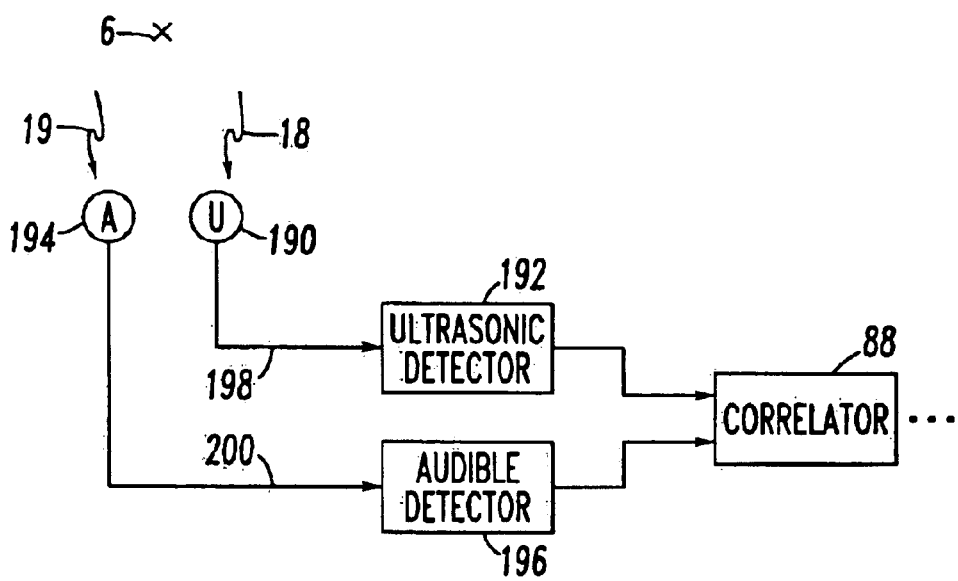
FIG. 7 is a block diagram of a detector circuit including audio and ultrasonic pick-up coils and audio and ultrasonic detectors for an arc fault locating and testing device in accordance with another embodiment of the invention.

For example, FIG. 7 shows an ultrasonic (U) pick-up coil 190 and an ultrasonic detector 192 in combination with an audible (A) pick-up coil 194 and an audible detector 196. The ultrasonic pick-up coil 190 receives the ultrasonic sound 18 and outputs a corresponding electrical signal 198, and the ultrasonic detector 192 detects that electrical signal 198. Similarly, the audible pick-up coil 194 receives the audible sound 19 and outputs a corresponding electrical signal 200, and the audible detector 196 detects that electrical signal 200. The circuit of FIG. 7 is used, for example, to determine the correlation between the ultrasonic sound 18 and the audible sound 19 characteristics of the arcing fault 6. Again, any combination of the various arc fault characteristics (e.g., two radio frequency characteristics 17 (as shown in FIG. 4); two ultrasonic characteristics 18; two audible characteristics 19; characteristics 17,18; characteristics 17,19; characteristics 18,19 (as shown in FIG. 7)) may be employed.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A testing device for detecting and locating an arcing fault in an electrical system having a plurality of electrical conductors, said arcing fault having a plurality of characteristics, said testing device comprising:

means for locating the electrical conductors of said electrical system;

means for detecting at least one of the characteristics of said arcing fault proximate one of said electrical conductors and outputting a responsive signal; and means for annunciating said responsive signal when said means for detecting is proximate said arcing fault; and wherein said means for locating the electrical conductors comprises means for generating a signal having a frequency in said electrical conductors, means for detecting said signal having the frequency proximate one of said electrical conductors and outputting a second responsive signal; and means for annunciating said second responsive signal when said means for detecting said signal having the frequency is proximate said one of said electrical conductors.

2. The testing device as recited in claim 1, wherein said means for generating a signal having a frequency comprises an alternating current plug having at least two prongs, and a transmitter structured to generate said signal having the frequency between the prongs of said alternating current plug.

3. The testing device as recited in claim 2, wherein the prongs of said alternating current plug are structured to engage an alternating current receptacle.

4. A testing device for detecting faults in an electrical system, and for detecting and locating an arcing fault in said electrical system, said arcing fault having a plurality of characteristics, said testing device comprising:

means for testing said electrical system to detect at least one fault in said electrical system;

means for detecting at least one of the characteristics of said-arcing fault proximate said arcing fault and outputting a responsive signal;

means for annunciating said responsive signal when said means for detecting is proximate said arcing fault; and wherein said means for testing includes means for conducting a ground fault test of said electrical system; and wherein said means for conducting a ground fault test includes first means for engaging a line conductor of said electrical system, second means for engaging a ground conductor of said electrical system; and means for adjusting a load between said first and second means, in order to provide between about 6 to 100 mA of leakage current in said line conductor and said ground conductor.

* * * * *